United States Patent
Jung et al.

(10) Patent No.: US 11,772,974 B2
(45) Date of Patent: Oct. 3, 2023

(54) GRAPHENE PREPARATION APPARATUS USING JOULE HEATING AND PREPARATION METHOD THEREFOR

(71) Applicant: CENTER FOR ADVANCED META-MATERIALS, Daejeon (KR)

(72) Inventors: Hyun June Jung, Daejeon (KR); Jae Hyun Kim, Daejeon (KR); Choong Man Moon, Busan (KR); Hak Joo Lee, Daejeon (KR); Bong Kyun Jang, Daejeon (KR); Kwang Seop Kim, Daejeon (KR); Seung Mo Lee, Nonsan-si (KR); Yun Hwangbo, Daejeon (KR)

(73) Assignee: CENTER FOR ADVANCED META-MATERIALS, Daejeon (KR)

( * ) Notice: Subject to any disclaimer, the term of this patent is extended or adjusted under 35 U.S.C. 154(b) by 589 days.

(21) Appl. No.: 16/958,738

(22) PCT Filed: Dec. 10, 2018

(86) PCT No.: PCT/KR2018/015588
§ 371 (c)(1),
(2) Date: Jun. 29, 2020

(87) PCT Pub. No.: WO2019/135502
PCT Pub. Date: Jul. 11, 2019

(65) Prior Publication Data
US 2020/0331758 A1    Oct. 22, 2020

(30) Foreign Application Priority Data
Jan. 2, 2018 (KR) .......................... 10-2018-0000253

(51) Int. Cl.
C01B 32/184 (2017.01)
B01J 6/00 (2006.01)
C01B 32/182 (2017.01)

(52) U.S. Cl.
CPC ............. *C01B 32/184* (2017.08); *B01J 6/008* (2013.01); *C01B 32/182* (2017.08)

(58) Field of Classification Search
CPC .................................................. C01B 32/184
See application file for complete search history.

(56) References Cited

U.S. PATENT DOCUMENTS

2017/0110751 A1*  4/2017  McAlister .............. C01B 32/40

FOREIGN PATENT DOCUMENTS

| KR | 10-2013-0114523 A | 10/2013 |
|---|---|---|
| KR | 10-2013-0128860 A | 11/2013 |
| KR | 10-2014-0121664 A | 10/2014 |
| KR | 10-2016-0106832 A | 9/2016 |
| KR | 10-2017-0060408 A | 6/2017 |

OTHER PUBLICATIONS

International Search Report for PCT/KR2018/015588 dated May 28, 2019 from Korean Intellectual Property Office.

* cited by examiner

*Primary Examiner* — Stuart L Hendrickson
(74) *Attorney, Agent, or Firm* — Revolution IP, PLLC

(57) ABSTRACT

Provided are a graphene preparation apparatus, including: a chamber having a space for preparation of graphene; a first electrode and a second electrode disposed in the chamber to be separated a predetermined distance from each other, the first electrode and the second electrode supporting a catalytic metal and receiving electric current for preparation of the graphene to heat the catalytic metal using Joule heating; additional heaters disposed at opposite sides of the catalytic metal, respectively, and heating the catalytic metal to compensate for a temperature difference between both end regions and a central region of the catalytic metal heated using Joule heating induced by the first electrode and the second electrode; and a current supply unit supplying electric current to the first electrode and the second electrode.

9 Claims, 5 Drawing Sheets

GRAPHENE PREPARATION APPARATUS USING JOULE HEATING AND PREPARATION METHOD THEREFOR

TECHNICAL FIELD

The present invention relates to a graphene preparation apparatus and a graphene preparation method using the same, and, more particularly, to a graphene preparation apparatus using Joule heating and a graphene preparation method using the same.

BACKGROUND ART

Materials composed of carbon atoms include fullerenes, carbon nanotubes, graphene, graphite, and the like. Thereamong, graphene is a two-dimensional monolayer sheet of carbon atoms.

In particular, graphene has not only stable and excellent electrical, mechanical, and chemical properties but also good electrical conductivity, and thus allows much faster electron transfer than silicon and a much larger current flow than copper. This has been proved by experiments since a method of separating graphene from graphite was reported in 2004, and a lot of research has been done in this regard.

Since graphene can be formed in a large area as well as having electrical, mechanical, and chemical stability and good electrical conductivity, graphene is receiving attention as a basic material for electronic circuits.

In addition, graphene can have electrical properties varying depending on crystal orientation thereof at a given thickness, and thus can be adjusted to exhibit electrical properties desired by a user, thereby allowing easy device design. Thus, graphene can be effectively used in carbon-based electrical or electromagnetic devices.

However, typical graphene preparation methods using joule heating, in which electric current is supplied to both ends of a catalytic metal to prepare graphene using Joule heating, have a problem of difficulty in preparing graphene having a uniform structure due to a temperature difference between a central region of the catalytic metal and both end regions of the catalytic metal.

DISCLOSURE

Technical Problem

Embodiments of the present invention have been conceived to overcome such a problem in the art and it is an aspect of the present invention to provide a graphene preparation apparatus using Joule heating, which includes additional heaters disposed in respective electrodes to compensate for a temperature difference between both end regions and a central region of a catalytic metal heated using Joule heating induced by the electrodes, thereby allowing the catalytic metal to be maintained at a uniform temperature across the entire region thereof, and a graphene preparation method using the same.

Technical Solution

In accordance with one aspect of the present invention, a graphene preparation apparatus using Joule heating includes: a chamber having a space for synthesis of graphene; a first electrode and a second electrode disposed in the chamber to be separated a predetermined distance from each other, the first electrode and the second electrode supporting a catalytic metal and receiving electric current for preparation of the graphene to heat the catalytic metal using Joule heating; additional heaters disposed at opposite sides of the catalytic metal, respectively, and heating the catalytic metal to compensate for a temperature difference between both end regions and a central region of the catalytic metal heated using Joule heating induced by the first electrode and the second electrode; and a current supply unit supplying electric current to the first electrode and the second electrode.

The graphene preparation apparatus may further include: a first support member and a second support member disposed to face the first electrode and the second electrode, respectively, with the catalytic metal interposed therebetween, wherein the additional heaters are disposed in one of the first electrode and the first support member and one of the second electrode and the second support member, respectively.

The additional heaters may be embedded in one of the first electrode and the first support member and one of the second electrode and the second support member, respectively.

Each of the first electrode, the second electrode, the first support member, and the second support member may be provided in the form of a roller.

The number of additional heaters disposed at the first electrode side may be equal to the number of additional heaters disposed at the second electrode side.

The graphene preparation apparatus may further include: a first connecting member connecting a side surface of the first electrode to a side surface of the first support member to selectively separate the first support member from the first electrode; and a second connecting member connecting a side surface of the second electrode to a side surface of the second support member to selectively separate the second support member from the second electrode.

The graphene preparation apparatus may further include: a temperature sensor disposed adjacent to each of the additional heaters to detect the temperature of the additional heaters; and an additional current supply unit connected to the additional heaters to supply electric current to the additional heaters.

Each of the additional heaters may have a built-in battery.

The graphene preparation apparatus may further include: a feed unit disposed in the chamber to supply the catalytic metal to a region for preparation of the graphene; and a reception unit separated a predetermined distance from the feed unit to receive the catalytic metal having the graphene formed thereon.

In accordance with another aspect of the present invention, a graphene preparation method using Joule heating includes: heating the additional heaters; maintaining the temperature of the additional heaters for a predetermined period of time; and forming the graphene on the catalytic metal using both heat generated by the additional heaters and Joule heating induced by the first electrode and the second electrode.

Advantageous Effects

The present invention provides a graphene preparation apparatus using Joule heating, which includes additional heaters disposed in respective electrodes to compensate for a temperature difference between both end regions and a central region of the catalytic metal heated using Joule heating induced by the electrodes, thereby allowing the catalytic metal to be maintained at a uniform temperature across the entire region of thereof, and a graphene preparation method using the same. Thus, according to the present invention, graphene having a uniform structure can be obtained.

BEST MODE

Figure 1:
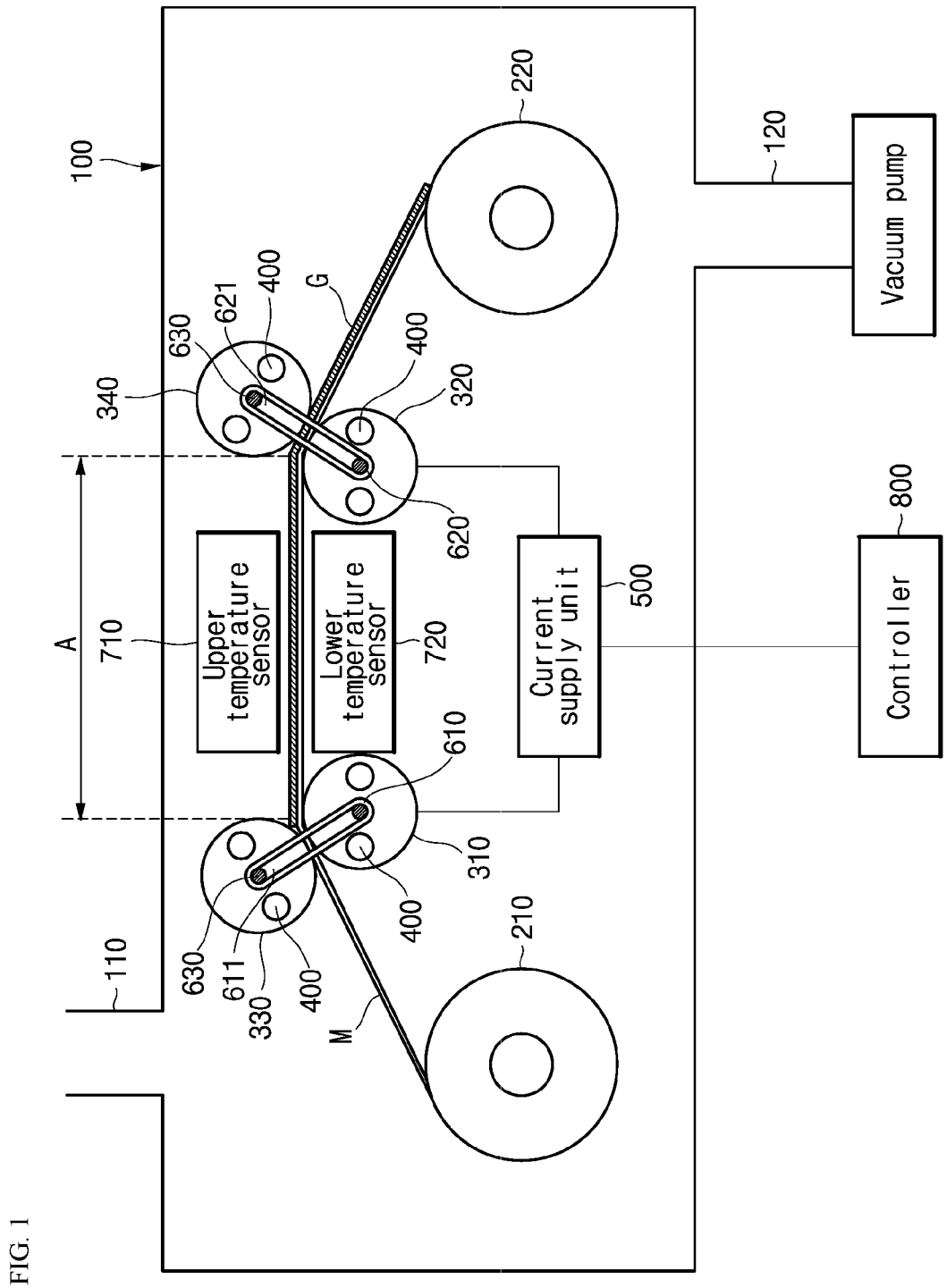
FIG. 1 is a schematic diagram of a graphene preparation apparatus using Joule heating according to one embodiment of the present invention.

Hereinafter, embodiments of the present invention will be described with reference to the accompanying drawings. It should be noted that like components will be denoted by like reference numerals throughout the specification and the accompanying drawings, and repeated description thereof will be omitted for clarity.

FIG. 1 is a schematic diagram of a graphene preparation apparatus using Joule heating according to one embodiment of the present invention.

Referring to FIG. 1, a graphene preparation apparatus using Joule heating according to the present invention includes a chamber 100, a feed unit 210, a reception unit 220, a first electrode 310, a second electrode 320, a first support member 330, a second support member 340, additional heaters 400, a current supply unit 500, a first connecting member 610, a second connecting member 620, and a controller 800.

The chamber 100 may be provided with a space for formation of graphene G, and may include a gas inlet 110 through which gases for preparation of the graphene are introduced into the chamber and a gas outlet 120 through which the gases are discharged from the chamber.

The feed unit 210 is disposed inside the chamber 100 to supply a catalytic metal M for formation of the graphene G.

The reception unit 220 is disposed inside the chamber 100 to be separated a predetermined distance from the feed unit 210. Here, the reception unit 220 may receive the catalytic metal M supplied from the feed unit 210 and having the graphene G formed thereon in the form of a roll.

As the feed unit 210 and the reception unit 220 are rotated, the catalytic metal M is transferred.

The first electrode 310 and the second electrode 320 are disposed between the feed unit 210 and the reception unit 220 to support the catalytic metal M and to supply electric current for heating the catalytic metal M. Here, each of the first electrode 310 and the second electrode 320 may be formed of copper.

Preferably, the first electrode 310 and the second electrode 320 closely contact the catalytic metal M. This serves to allow electric current to be smoothly supplied to the catalytic metal M through the first electrode 310 and the second electrode 320.

A preparation region A for formation of the graphene G on the catalytic metal M may be formed between the first electrode 310 and the second electrode 320.

Each of the first electrode 310 and the second electrode 320 may be provided in the form of a roller to be brought into line contact or surface contact with the catalytic metal M to uniformly supply electric current to the catalytic metal M.

The first support member 330 and the second support member 340 may be disposed to face the first electrode 310 and the second electrode 320, respectively, with the catalytic metal M interposed therebetween, thereby supporting the catalytic metal M in cooperation with the first electrode 310 and the second electrode 320, respectively.

Here, the first support member 330 and the second support member 340 may be formed of copper, like the first electrode 310 and the second electrode 320.

The additional heaters 400 may be disposed at opposite sides of the catalytic metal M, respectively, to compensate for a temperature difference between both end regions and a central region of the catalytic metal M heated using Joule heating induced by electric current applied between the first electrode 310 and the second electrode 320.

Here, each of the additional heaters 400 may be a cartridge-type heater.

In one embodiment, the additional heaters may be disposed in one of the first electrode 310 and the first support member 330 and one of the second electrode 320 and the second support member 340, respectively.

In another embodiment, the additional heaters may be embedded in the first electrode 310, the second electrode 320, the first support member 330, and the second support member 340, respectively.

Preferably, the number of additional heaters 400 disposed at the first electrode 310 side is equal to the number of additional heaters 400 disposed at the second electrode 320 side. This serves to allow heat to be uniformly transferred to both ends of the catalytic metal M.

In this embodiment, it is described that two additional heaters 400 are embedded in each of the first electrode 310 and the first support member 330, and, corresponding thereto, two additional heaters 400 are embedded in each of the second electrode 320 and the second support member 340. However, it will be understood that the present invention is not limited thereto and the number of additional heaters 400 may be varied depending on the size and characteristics of the graphene preparation apparatus.

Now, the additional heaters 400 will be described more in detail. Upon heating the catalytic metal M using Joule heating induced by the first electrode 310 and the second electrode 320, the temperature of the catalytic metal M increases from both end regions of the catalytic metal M toward the central region of the catalytic metal M.

Conversely, upon heating the catalytic metal M using heat generated when the additional heaters 400 heat the first electrode 310, the first support member 330, the second electrode 320, and the second support member 340, the temperature of the catalytic metal M decreases from both end regions of the catalytic metal M toward the central region of the catalytic metal M.

Accordingly, upon heating the catalytic metal M using both heat generated by the additional heaters 400 and Joule heating induced by the first electrode 310 and the second electrode 320, a uniform temperature profile can be obtained across the entire region of the catalytic metal M since heat generated by the additional heaters 400 compensate for a temperature difference between the central region of the catalytic metal M and both end regions of the catalytic metal M, which are heated to a lower temperature than the central region upon heating the catalytic metal using Joule heating. Details of operation of the additional heaters 400 will be described further below with reference to graphs.

The first connecting member 610 connects a side surface of the first electrode 310 to a side surface of the first support member 330 to selectively separate the first support member 330 from the first electrode 310.

Here, the first connecting member 610 may include two first connecting members which connect opposite side surfaces of the first electrode 310 to opposite side surfaces of the first support member 330, respectively.

The first connecting member 610 may have a first slit hole 611 formed in a longitudinal direction thereof. In addition, the first connecting member 610 may be coupled to the side surface of the first electrode 310 and the side surface of the first support member 330 via separate fastening members 630, respectively.

That is, with the first connecting member connecting the first support member 330 to the first electrode 310, one end of the catalytic metal M disposed between the first electrode 310 and the first support member 330 can be supported and secured between the first support member 330 and the first electrode 310.

The second connecting member 620 connects a side surface of the second electrode 320 to a side surface of the second support member 340 to selectively separate the second support member 340 from the second electrode 320.

Here, the second connecting member 620 may include two second connecting members which connect opposite side surfaces of the second electrode 320 to opposite side surfaces of the second support member 340, respectively.

The second connecting member 620 may have a second slit hole 611 formed in a longitudinal direction thereof. In addition, the second connecting member 610 may be coupled to the side surface of the second electrode 320 and the side surface of the second support member 340 via separate fastening members 630, respectively.

Since the structure of the second connecting member 620 is the same as that of the first connecting member 610, detailed description thereof will be omitted.

According to the present invention, since the first electrode 310 and the first support member 330 are connected to each other via the first connecting member 610 to be selectively separated from each other and the second electrode 320 and the second support member 340 are connected to each other via the second connecting member 620 to be selectively separated from each other, the first support member 330 and the second support member 340 can be separated from the first electrode 310 and the second electrode 320, respectively, as needed.

That is, the first support member 330 and the second support member 340, which are adapted to support opposite ends of the catalytic metal M, respectively, may be separated from the first electrode 310 and the second electrode 320 in order to, for example, perform repair and replacement.

The current supply unit 500 is connected to the first electrode 310 and the second electrode 320 to supply electric current to the first electrode 310 or the second electrode 320.

Here, the electric current supplied from the current supply unit 500 may be alternating current or direct current.

Although a method of directly supplying electric current to the electrodes using the current supply unit 500 is used in this embodiment, it will be understood that the present invention is not limited thereto and the catalytic metal M may be heated using high-frequency induction heating to form the graphene G on the catalytic metal M.

Although not shown in the drawings, the graphene preparation apparatus may further include: a temperature sensor (not shown) disposed adjacent to each of the additional heaters 400 to detect the temperature of the additional heaters 400; and an additional current supply unit (not shown) connected to the additional heaters 400 to supply electric current to the additional heaters 400.

That is, the temperature of each of the additional heaters 400 can be controlled by detecting the temperature of the additional heaters 400 using the temperature sensor. In addition, the additional heaters 400 can be adjusted to a predetermined temperature by regulating electric current supplied from the additional current supply unit.

However, it will be understood that the additional heaters 400 are not necessarily heated by external electric current. For example, a heater having a built-in battery may be used as the additional heaters 400.

The graphene preparation apparatus may further include an upper temperature sensor 710 disposed in the preparation region A to measure a temperature distribution in the preparation region A.

In addition, the graphene preparation apparatus may further include a lower temperature sensor 720 disposed under the catalytic metal M to measure the temperature of the catalytic metal M to control electric current supplied to the catalytic metal M. That is, based on a temperature value measured by the lower temperature sensor 720, a required amount of electric current can be supplied from the current supply unit 400.

The controller 800 may control the amount of electric current supplied from the current supply unit 500 to each of the electrodes 310, 320 based on the temperature value measured by the lower temperature sensor 720 to adjust the temperature to which the catalytic metal M is heated.

In addition, the controller 800 may control the gas inlet 110 to supply a reaction gas.

The reaction gas (feed gas), which is a carbon-containing gas, may be supplied through the gas inlet 110 of the chamber 100.

The reaction gas may include, for example, at least one selected from the group consisting of methane, carbon monoxide, carbon dioxide, ethane, ethylene, ethanol, acetylene, propane, propylene, butane, butadiene, pentane, pentene, cyclopentadiene, hexane, cyclohexane, benzene, and toluene.

In addition to the reaction gas, a carrier gas for transporting the reaction gas to the catalytic metal M and a reducing gas for removing impurities from a surface of the catalytic metal M may also be supplied through the gas inlet 110.

Here, the carrier gas may include an inert gas such as helium or argon.

Here, the reducing gas may include a non-reaction gas such as hydrogen.

That is, hydrogen gas used as the reducing gas induces a reducing atmosphere to control (that is, remove) impurities in the catalytic metal through reduction with the catalytic metal.

In addition, a control valve (not shown) may be disposed at the gas inlet 110 and a gas discharge unit to control the amount of the gases supplied to the chamber 100 through the gas inlet 110.

The graphene preparation apparatus may further include a vacuum pump disposed at the gas outlet 120 of the chamber 100 to allow the reaction gas required for preparation of the graphene G, the carrier gas, and the reducing gas to fill the chamber 100 or to be discharged from the chamber 100.

Figure 2:
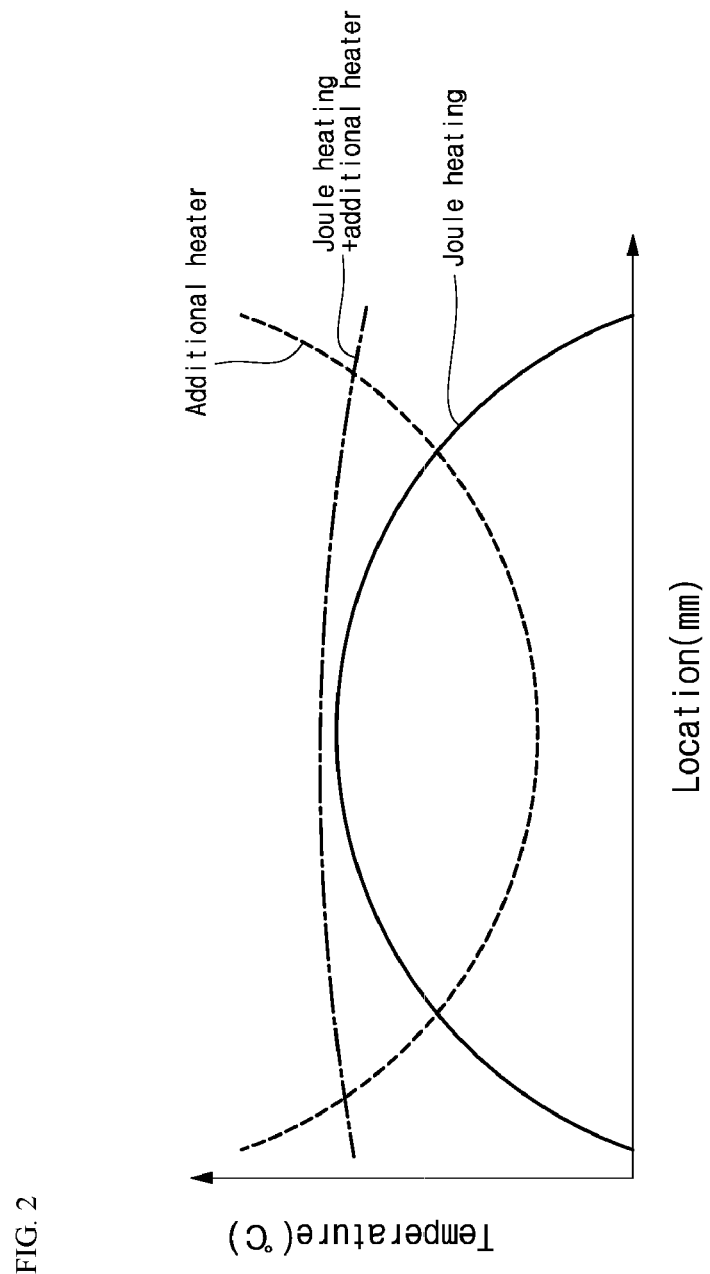
FIG. 2 is a graph showing temperature profiles along the length of a catalytic metal heated by electrodes and/or additional heaters according to one embodiment of the present invention.

FIG. 2 is a graph showing temperature profiles along the length of the catalytic metal heated by the electrodes and/or the additional heaters according to one embodiment of the present invention. In FIG. 2, the solid line represents a temperature profile along the length of the catalytic metal heated using Joule heating induced by the electrodes, the dotted line represents a temperature profile along the length of the catalytic metal heated by the additional heaters, and the alternate long and short dash line represents a temperature profile along the length of the catalytic metal heated using both Joule heating and the additional heaters.

Now, the temperature profile along the length of the catalytic metal M heated using Joule heating induced by the electrodes 310, 320 and the temperature profile along the length of the catalytic metal M heated using the additional heaters 400 will be described with reference to FIG. 1 and FIG. 2.

First, the temperature profile along the length of the catalytic metal M heated using Joule heating induced by the electrodes 310, 320 will be described.

Upon heating the catalytic metal M using Joule heating by supplying electric current from the current supply unit 500 to the first electrode 310 and the second electrode 320, electric current supplied from the current supply unit 500 passes through the first electrode 310 and the second electrode 320 and heat is generated by resistance of the catalytic metal (M). As a result, the central region of the catalytic metal M has a higher temperature than both end regions of the catalytic metal M.

More specifically, the central region of the catalytic metal M has a higher temperature than one end region of the catalytic metal M engaged between the first electrode 310 and the first support member 330 and the other end region of the catalytic metal M engaged between the second electrode 320 and the second support member 340. This is because heat is generated by resistance of the catalytic metal (M), as described above.

That is, upon heating the catalytic metal M using Joule heating induced by the electrodes 310, 320, the temperature of the central region of the catalytic metal M becomes higher than those of both end regions of the catalytic metal M, causing a temperature difference therebetween. As a result, a temperature profile as denoted by the solid line of FIG. 2 is obtained.

Next, the temperature profile along the length of the catalytic metal M heated using the additional heaters 400 will be described.

When electric current is supplied to the additional heaters 400 from the current supply unit 500, the additional heaters 400 generate heat to heat the first electrode 310, the second electrode 320, the first support member 330, and the second support member 340.

More specifically, respective additional heaters 400 embedded in the first electrode 310 and the first support member 330 heat the first electrode 310 and the first support member 330, which, in turn, heat the one end of the catalytic metal M.

At the same time, respective additional heaters 400 embedded in the second electrode 320 and the second support member 340 heat the second electrode 320 and the second support member 340, which, in turn, heat the other end of the catalytic metal M.

Heat generated from the electrodes 310, 320 and the support members 330, 340, which are heated by the respective additional heaters 400, is transferred to the central region of the catalytic metal M after passing through the one end of the catalytic metal M engaged between the first electrode 310 and the first support member 330 and the other end of the catalytic metal M engaged between the second electrode 320 and the second support member 340.

That is, upon heating the catalytic metal M using the additional heaters 400, the temperature of the central region of the catalytic metal M becomes lower than those of both end regions of the catalytic metal M, causing a temperature difference therebetween. As a result, a temperature profile as denoted by the dotted line of FIG. 2 is obtained.

Accordingly, upon heating the catalytic metal M using the electrodes 310, 320, the support members 330, 340, and the additional heaters 400, the catalytic metal M can have a uniform temperature across the entire region thereof since heat generated by the additional heaters 400 compensates for a temperature difference between both end regions and the central region of the catalytic metal M heated using Joule heating induced by the first electrode 310 and the second electrode 320. As a result, a temperature profile as denoted by the alternate long and short dash line of FIG. 2 is obtained.

Since the catalytic metal M has a uniform temperature across the entire region of thereof, graphene having a uniform structure can be prepared.

Next, a graphene preparation method using Joule heating according to one embodiment of the present invention will be described.

Figure 3:
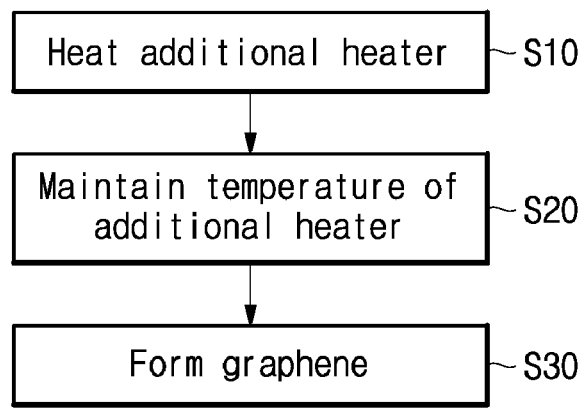
FIG. 3 is a flowchart of a graphene preparation method using Joule heating according to one embodiment of the present invention.

FIG. 3 is a flowchart of a graphene preparation method using Joule heating according to one embodiment of the present invention.

Referring to FIG. 1 and FIG. 3, the graphene preparation method using Joule heating according to this embodiment includes: an additional heater heating step S10, an additional heater temperature maintenance step S20, and a graphene formation step S30.

First, in the additional heater heating step S10, electric current is supplied to the additional electrodes 400 embedded in the first electrode 310, the second electrode 320, the first support member 330, and the second support member 340, respectively, to heat the additional electrodes 400.

That is, in the additional heater heating step S10, the controller 800 performs control to gradually increase electric current supplied to the additional electrodes 400 from the current supply unit 500 to increase the temperature of the additional heaters 400 to a predetermined value.

Next, in the additional heater temperature maintenance step S20, the temperature of the additional heaters 400 is maintained for a predetermined period of time.

That is, when the additional heaters 400 are heated in the additional heater heating step S10, heat is generated from the heated additional heaters 400 and is transferred to the electrodes 310, 320 and the support members 330, 340.

Since the electrodes 310, 320 and the support members 330, 340 are formed of copper, it takes a certain amount of time for heat generated from the additional heaters 400 to increase the temperatures of the electrodes 310, 320 and the support members 330, 340 to a predetermined temperature.

Accordingly, in the additional heater temperature maintenance step S20, the electrodes 310, 320 and the support members 330, 340 are heated using heat generated from the additional heaters 400.

Next, in the graphene formation step S30, electric current is supplied to the first electrode 310 and the second electrode 320 to induce Joule heating, whereby the graphene G is formed on the catalytic metal M using both heat generated from the additional heaters 400 and Joule heating induced by the electrodes 310, 320.

That is, upon heating the catalytic metal M using the electrodes 310, 320, the support members 330, 340, and the additional heaters 400, the catalytic metal M can have a uniform temperature across the entire region thereof since heat generated from the additional heaters 400 compensates for a temperature difference between both end regions and the central region of the catalytic metal M heated using Joule heating induced by the first electrode 310 and the second electrode 320.

Figure 4:
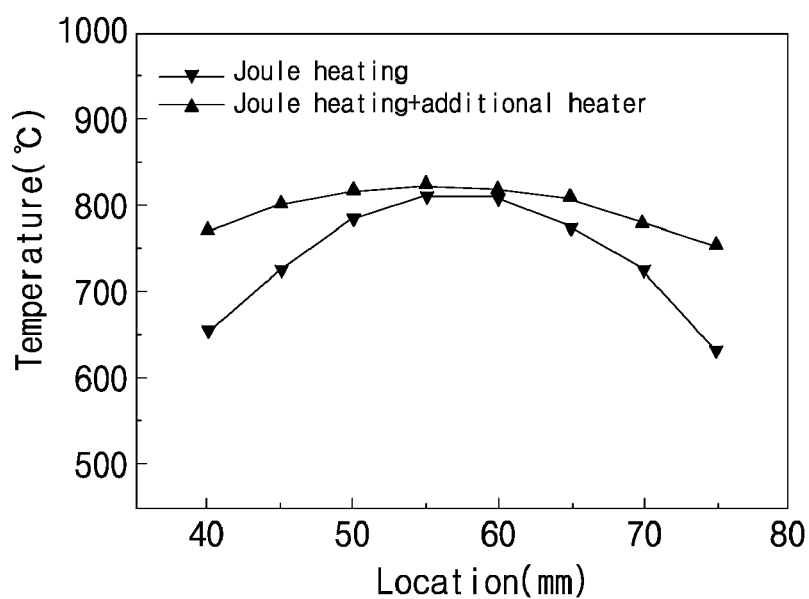
FIG. 4 is a graph comparing a temperature profile along the length of the catalytic metal heated by the electrodes with a temperature profile along the length of the catalytic metal heated by both the electrodes and the additional heaters according to one embodiment of the present invention.

FIG. 4 is a graph comparing a temperature profile along the length of the catalytic metal heated using Joule heating induced by the electrodes with a temperature profile along the length of the catalytic metal heated using both Joule heating induced by the electrodes and heat generated from the additional heaters according to one embodiment of the present invention.

Referring to FIG. 4, the catalytic metal M heated using only Joule heating induced by the first electrode 310 and the second electrode 320 has a temperature profile in which the temperature of the catalytic metal M increases from both ends of the catalytic metal M toward the central region of the catalytic metal M, as described above.

Conversely, the catalytic metal M heated using both heat generated from the additional heaters 400 and Joule heating induced by the first electrode 310 and the second electrode 320 has a relatively uniform temperature profile across the entire region thereof since heat generated from the additional heaters 400 compensates for a temperature difference between the central region of the catalytic metal M and both end regions of the catalytic metal M, which are heated to a lower temperature than the central region upon heating the catalytic metal M using Joule heating.

Figure 5:
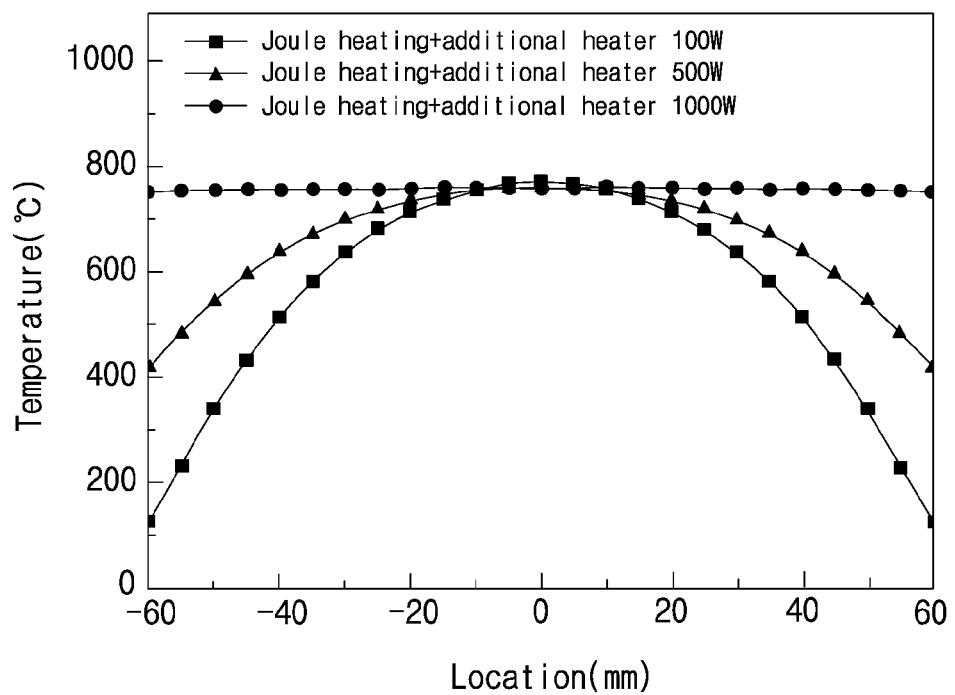
FIG. 5 is a graph showing temperature profiles along the length of the catalytic metal depending on electric power supplied to the additional heaters according to one embodiment of the present invention.

FIG. 5 is a graph showing temperature profiles along the length of the catalytic metal depending on electric power supplied to the additional heaters according to one embodiment of the present invention. In FIG. 5, the temperature profile denoted by square dots is a temperature profile along the length of the catalytic metal when an electric power of 100 W is supplied to the additional heaters, the temperature profile denoted by triangular dots is a temperature profile along the length of the catalytic metal when an electric power of 500 W is supplied to the additional heaters, and the temperature profile denoted by circular dots is a temperature profile along the length of the catalytic metal when an electric power of 1,000 W is supplied to the additional heaters.

Referring to the graphs of FIG. 5, it can be seen that the catalytic metal M has a more uniform temperature profile across the entire region thereof with increasing electric power supplied to the additional heaters 400.

Next, a graphene preparation apparatus using Joule heating according to another embodiment of the present invention will be described. Regarding the graphene preparation apparatus using Joule heating according to this embodiment, the same components as in the above embodiment will be denoted by the same reference numerals as in the above embodiment and detailed description thereof will be omitted.

Figure 6:
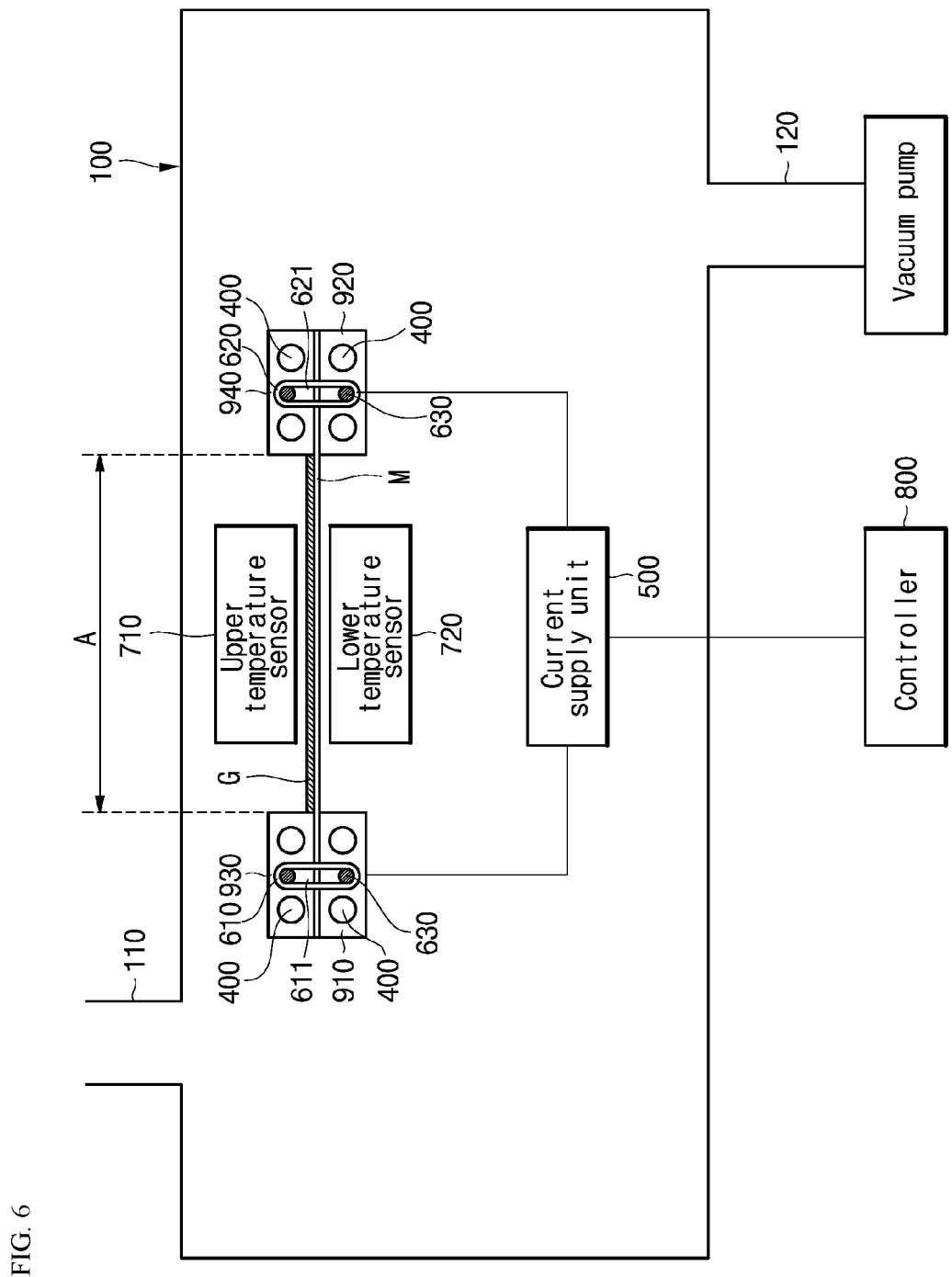
FIG. 6 is a schematic diagram of the graphene preparation apparatus using Joule heating according to this embodiment.

FIG. 6 is a schematic diagram of the graphene preparation apparatus using Joule heating according to this embodiment.

The graphene preparation apparatus shown in FIG. 6 differs from the graphene preparation apparatus shown in FIG. 1 in that the graphene preparation apparatus shown in FIG. 1 includes the feed unit 210 and the reception unit 220 to be applied to a roll-to-roll process suitable for continuous preparation of the graphene G and the graphene preparation apparatus shown in FIG. 6 is applied to a process suitable for preparation of sheet-type graphene G.

Accordingly, in the above embodiment of the present invention, each of the electrodes 310, 320 and the support members 330, 340 is provided in the form of a roller, whereas, in this embodiment of the present invention, each of electrodes 910, 920 and support members 930, 940 is provided in the form of a plate having a predetermined thickness.

In this embodiment, only first and second electrodes 910, 920 and first and second support members 930, 940, which have different structures than those in the above embodiment, will be described.

The first electrode 910 and the second electrode 920 are disposed between the feed unit 210 and the reception unit 220 to support the catalytic metal M and to supply electric current for heating the catalytic metal M.

A preparation region A for formation of graphene G on the catalytic metal M may be formed between the first electrode 910 and the second electrode 920.

In addition, each of the first electrode 910 and the second electrode 920 may be provided in the form of a plate having a predetermined thickness to be brought into surface contact with the catalytic metal M to uniformly supply electric current to the catalytic metal M.

A first support member 930 and a second support member 940 may be disposed to face the first electrode 910 and the second electrode 920, respectively, with the catalytic metal M interposed therebetween, thereby supporting the catalytic metal M in cooperation with the first electrode 910 and the second electrode 920, respectively.

Here, each of the first support member 930 and the second support member 940 may be provided in the form of a plate having a predetermined thickness, like the first electrode 310 and the second electrode 920.

That is, in the graphene preparation apparatus using Joule heating according to this embodiment, which is applied to a batch process for preparation of graphene, upon heating the catalytic metal M using both Joule heating induced by the first electrode 910 and the second electrode 920 and heat generated from the additional heaters 400, the catalytic metal M can have a uniform temperature across the entire region thereof since heat generated from the additional heaters 400 can compensate for a temperature difference between both end regions and the central region of the catalytic metal M heated using Joule heating induced by the first electrode 910 and the second electrode 920.

Although some embodiments have been described herein, it should be understood that these embodiments are provided for illustration only and are not to be construed in any way as limiting the present invention, and that various modifications, changes, alterations, and equivalent embodiments can be made by those skilled in the art without departing from the spirit and scope of the invention.

INDUSTRIAL APPLICABILITY

The present invention has industrially applicability in the field of preparation of graphene using Joule heating.

The invention claimed is:

1. A graphene preparation apparatus using Joule heating, comprising:
   a chamber having a space for preparation of graphene;
   a first electrode and a second electrode disposed in the chamber to be separated a predetermined distance from each other, the first electrode and the second electrode supporting a catalytic metal and receiving electric current for preparation of the graphene to heat the catalytic metal using Joule heating;
   additional heaters embedded in the first and the second electrodes, respectively, the additional heater heating the first and the second electrodes, respectively to heat the catalytic metal to compensate for a temperature difference between both end regions and a central region of the catalytic metal heated using Joule heating induced by the first electrode and the second electrode; and
   a current supply unit supplying electric current to the first electrode and the second electrode.

2. The graphene preparation apparatus according to claim 1, further comprising:
   a first support member disposed to face the first electrode, wherein the catalyst metal is disposed between the first support member and the first electrode; and
   a second support member disposed to face the second electrode, wherein the catalyst metal is disposed between the second support member and the second electrode,
   wherein the additional heaters are disposed in the first support member and the second support member, respectively.

3. The graphene preparation apparatus according to claim 2, further comprising:
   a first connecting member connecting a side surface of the first electrode to a side surface of the first support member to selectively separate the first support member from the first electrode; and
   a second connecting member connecting a side surface of the second electrode to a side surface of the second support member to selectively separate the second support member from the second electrode.

4. The graphene preparation apparatus according to claim 2, wherein each of the first electrode, the second electrode, the first support member, and the second support member is provided in the form of a roller.

5. The graphene preparation apparatus according to claim 4, further comprising:
   a feed unit disposed in the chamber to supply the catalytic metal to a region for preparation of the graphene; and
   a reception unit separated a predetermined distance from the feed unit to receive the catalytic metal having the graphene formed thereon.

6. The graphene preparation apparatus according to claim 1, wherein each of the additional heaters has a built-in battery.

7. The graphene preparation apparatus according to claim 1, further comprising:
   a temperature sensor disposed adjacent to each of the additional heaters to detect the temperature of the additional heaters; and
   an additional current supply unit connected to the additional heaters to supply electric current to the additional heaters.

8. The graphene preparation apparatus according to claim 1, wherein the number of additional heaters disposed at the first electrode side is equal to the number of additional heaters disposed at the second electrode side.

9. A graphene preparation method using Joule heating, the graphene being prepared using the graphene preparation apparatus according to claim 1, the graphene preparation method comprising:
   heating the additional heaters;
   maintaining the temperature of the additional heaters for a predetermined period of time; and
   forming the graphene on the catalytic metal using both heat generated by the additional heaters and Joule heating induced by the first electrode and the second electrode.

* * * * *